United States Patent
Lee et al.

(10) Patent No.: US 9,990,312 B2
(45) Date of Patent: Jun. 5, 2018

(54) MEMORY SYSTEM AND OPERATION METHOD OF THE SAME

(71) Applicant: SK hynix Inc., Gyeonggi-do (KR)

(72) Inventors: Sung-Eun Lee, Gyeonggi-do (KR);
Jung-Hyun Kwon, Gyeonggi-do (KR);
Jing-Zhe Xu, Gyeonggi-do (KR);
Yong-Ju Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 155 days.

(21) Appl. No.: 15/257,389

(22) Filed: Sep. 6, 2016

(65) Prior Publication Data
US 2017/0329726 A1    Nov. 16, 2017

(30) Foreign Application Priority Data

May 13, 2016  (KR) .......................... 10-2016-0058755

(51) Int. Cl.
*G06F 3/00*    (2006.01)
*G06F 13/16*   (2006.01)
*G11C 29/00*   (2006.01)
*G06F 13/40*   (2006.01)

(52) U.S. Cl.
CPC ........ *G06F 13/161* (2013.01); *G06F 13/1684* (2013.01); *G06F 13/404* (2013.01); *G06F 13/4027* (2013.01); *G11C 29/76* (2013.01)

(58) Field of Classification Search
None
See application file for complete search history.

(56) References Cited

U.S. PATENT DOCUMENTS 9,466,393 B2 * 10/2016 Kim ...................... G11C 29/04
2005/0262323 A1 * 11/2005 Woo ...................... G06F 13/161
                                                                711/167

FOREIGN PATENT DOCUMENTS

KR        1020150027895       3/2015

* cited by examiner

*Primary Examiner* — Idriss N Alrobaye
*Assistant Examiner* — Richard B Franklin
(74) *Attorney, Agent, or Firm* — IP & T Group LLP (57) ABSTRACT

A memory system includes: a plurality of memory devices, one of which includes an unrepaired defective memory cell; a control bus that is shared by the plurality of the memory devices; a plurality of data buses assigned to each of the plurality of the memory devices; and a memory controller that communicates with the plurality of the memory devices through the control bus and the plurality of the data buses, a control latency of the memory device including unrepaired defective memory cells is set differently from a control latency of the other memory devices, where the control latency is used for recognizing control signals of the control bus.

20 Claims, 5 Drawing Sheets

# MEMORY SYSTEM AND OPERATION METHOD OF THE SAME

CROSS-REFERENCE TO RELATED APPLICATIONS

The present application claims priority under 35 U.S.C. 119(a) to Korean Patent Application No. 10-2016-0058755, filed on May 13, 2016, which is incorporated herein by reference in its entirety.

BACKGROUND

1. Field

Various embodiments of the present invention relate generally to a memory system.

2. Description of the Related Art

Generally, as capacity of a memory device increases, it becomes more difficult to fabricate the memory device without any defective memory cells.

To address this problem, redundancy memory cells are employed in a memory device for replacing defective memory cells. The technique of replacing defective memory cells with redundancy memory cells is known as repairing the defective memory cells. However, when the number of the defective memory cells is greater than the number of the redundancy memory cells, some defective memory cells are left unrepaired. When a memory device includes unrepaired defective memory cells the memory device is typically no longer usable and is abandoned or discarded.

SUMMARY

Embodiments of the present invention are directed to a memory system and a method of operation thereof that makes it possible to continue using a memory device despite including unrepaired defective memory cells instead of abandoning the memory device.

In accordance with an embodiment of the present invention, a memory system includes: a plurality of memory devices, one of which includes an unrepaired defective memory cell; a control bus that is shared by the plurality of the memory devices; a plurality of data buses assigned to each of the plurality of the memory devices; and a memory controller that communicates with the plurality of the memory devices through the control bus and the plurality of the data buses, a control latency of the memory device including the unrepaired defective memory cell is set differently from a control latency of the other memory devices, where the control latency is used for recognizing control signals of the control bus.

The memory controller may include: a mapping unit that maps the unrepaired defective memory cell to a normal memory cells.

When the memory controller transfers a first address corresponding to a memory cell disposed in the same positions that the defective memory cell is disposed to the other memory devices, a second address mapped by the mapping unit may be transferred to the memory device including the unrepaired defective memory cell.

The memory controller may transfer the first address with a first control latency through the control bus, and transfer the second address with a second control latency that is different from the first control latency through the control bus.

When the memory controller transfers an address corresponding to memory cells other than the memory cell disposed in the same position that the defective memory cell is disposed to the other memory devices, the same address may be transferred to the memory device including the unrepaired defective memory cell.

The control signals may include a chip selection signal, command signals, and address signals, and the control latency may be a command address latency representing a timing difference between the chip selection signal and the other control signals.

The memory controller may further include: a host interface for communication with a host; a scheduling unit that decides a processing order for processing requests transferred from the host; a command generation unit that generates a command to be applied to the plurality of the memory devices; and a memory interface for communication with the plurality of the memory devices.

The defective memory cells in the other memory devices may be all repaired.

In accordance with another embodiment of the present invention, a method for operating a memory system including a plurality of memory devices and a memory controller communicating with the plurality of the memory devices through a control bus and a plurality of data buses assigned to each of the plurality of the memory devices, includes: the memory controller setting a command address latency of a memory device including an unrepaired defective memory cell among the plurality of the memory devices to a first value; the memory controller setting a command address latency of the other memory devices to a second value that is different from the first value; the memory controller transferring a command and a first address with the command address latency of the second value through the control bus to access the other memory devices; and when a memory cell disposed in the same position that the unrepaired defective memory cell is disposed is accessed in the process of the memory controller transferring the command and the first address with the command address latency of the second value through the control bus to access the other memory devices, the memory controller transferring the command having the command address latency of the second value and a second address that is different from the first address through the control bus to access the memory device including the unrepaired defective memory cell.

The method may further include: when memory cells not disposed in the same position that the unrepaired defective memory cell is disposed are accessed in the process of the memory controller transferring the command and the first address with the command address latency of the second value through the control bus to access the other memory devices, the memory controller transferring the command having the command address latency of the second value and the first address through the control bus to access the memory device including the unrepaired defective memory cells.

The second address may be an address of memory cells for replacing the defective memory cells in the memory device including the unrepaired defective memory cells.

DETAILED DESCRIPTION

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art to which the present invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "Includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Figure 1:
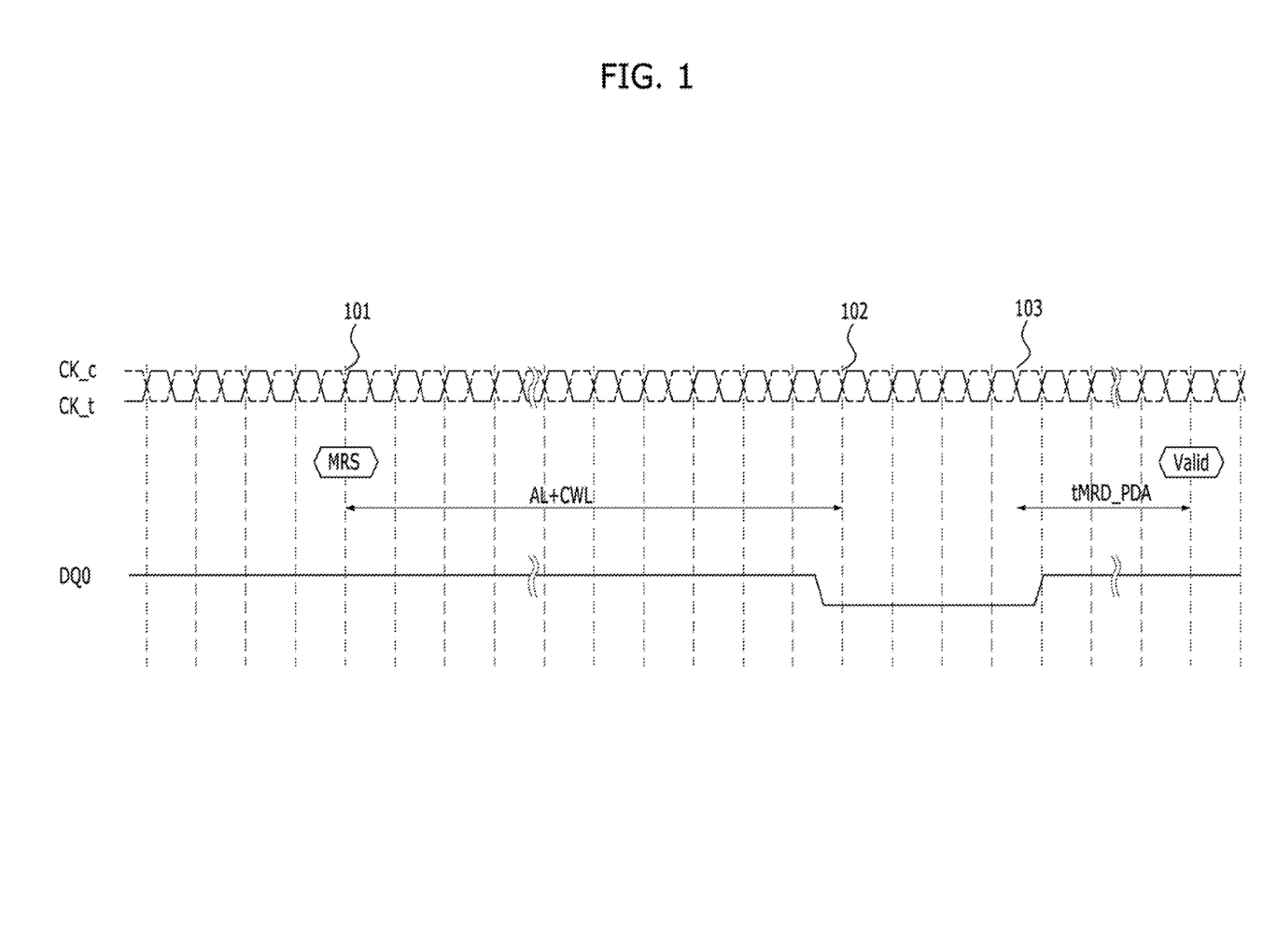
FIG. 1 is a timing diagram illustrating an operation of a mode register set (MRS) in a per dynamic random access memory addressability (PDA) mode of a memory device.

FIG. 1 is a timing diagram illustrating an operation of the mode register set (MRS) in the PDA mode of a memory device.

In the PDA mode, an independent MRS operation is performed to each memory devices. In the PDA mode, validity of MRS commands may be determined on the basis of a signal level of a $0^{th}$ data pad DQ0. When the signal level of the $0^{th}$ data pad DQ0 is '0' after a write latency WL from the application of an MRS command, it is decided that the applied MRS command is valid. The write latency WL equals an additive latency AL and a CAS write latency according to the following equation: WL=AL+CWL, wherein AL represents an additive latency, CWL represents a CAS write latency, and CAS represents a column address strobe. When the signal level of the $0^{th}$ data pad DQ0 is '1' after the write latency WL passes from the application of the MRS command, it is decided that the applied MRS command is invalid and thus disregarded.

Referring to FIG. 1, an MRS command MRS is applied to the memory device at a moment '101'. The signal level of the $0^{th}$ data pad DQ0 transitions to '0' for a predetermined duration at a moment '102' when the elapsed time from the moment '101' becomes equal to a write latency WL (WL=AL+CWL). Therefore, the MRS command applied at the moment '101' is decided to be valid, and the memory device begins to perform a setup operation using an address (not shown) inputted along with the MRS command during a MRS command cycle time tMRD_PDA from a moment '103'.

If the signal level of the 0$^{th}$ data pad DQ0 at the moment '102' is maintained to be '1', the MRS command applied at the moment '101' is decided to be invalid and thus it is disregarded. In other words, the setup operation of the memory device is not performed.

In accordance with an embodiment of the present invention, in the PDA mode, it is possible to differently set up the plurality of memory devices which share a control bus for transferring commands and addresses.

Figure 2:
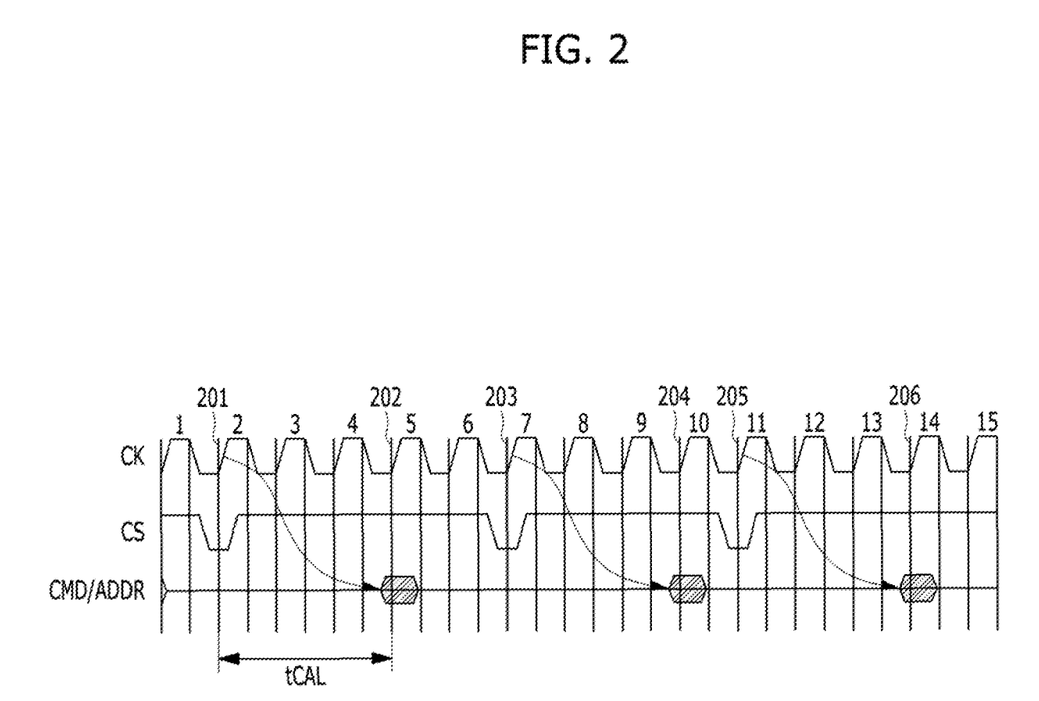
FIG. 2 is a timing diagram illustrating a command address latency (CAL) of a memory device.

FIG. 2 is a timing diagram illustrating the command address latency (CAL) of a memory device.

The CAL represents the timing difference between a chip selection signal CS and the other signals. The chip selection signal CS may be a reference signal among the control signals transferred through a control bus CMD/ADDR_BUS. The memory device recognizes as valid only the control signals that are inputted after a time corresponding to the CAL from the application of the chip selection signal CS. The value of the CAL may be set up by the MRS.

FIG. 2 illustrates a case where the CAL is set to a value of 3, which means 3 clock cycles. At a moment '202' i.e., at three clock cycles after a moment '201' when the chip selection signal CS of a logic low level is applied to a selected memory device, a command CMD other than the chip selection signal CS and an address ADDR are applied to the selected memory device. The memory device then recognizes as valid the command CMD and the address ADDR applied at the moment '202'. The selected memory device recognizes as invalid any other command CMD and address ADDR applied thereto at any moment other than the moment '202' three clock cycles after the moment '201' of the application of the chip selection signal CS.

The selected memory device also recognizes as valid the command CMD and the address ADDR applied thereto at moments '204' and '206' three clock cycles respectively after the moments '203' and '205' when the chip selection signal CS is applied thereto.

Figure 3:
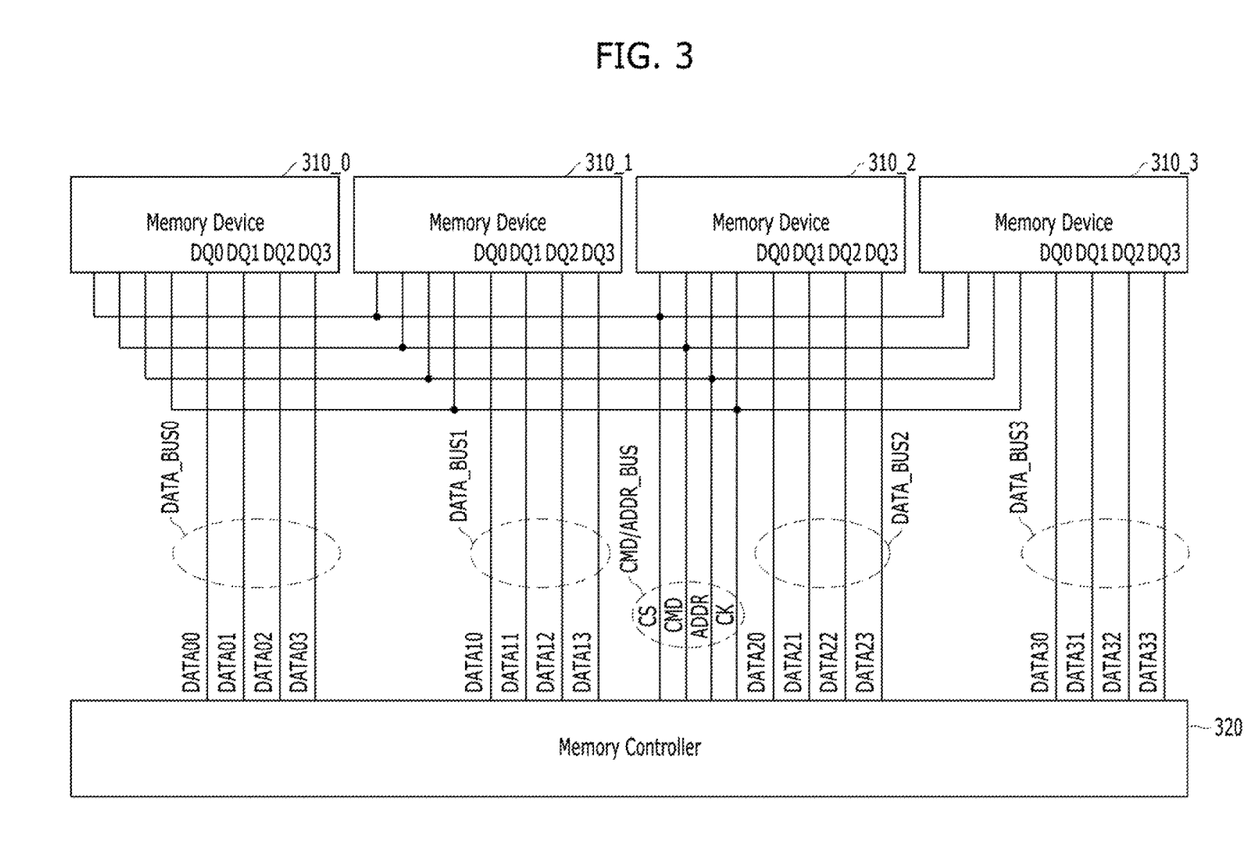
FIG. 3 is a block diagram illustrating a memory system, in accordance with an embodiment of the present invention.

FIG. 3 illustrates a memory system, in accordance with an embodiment of the present invention.

Referring to FIG. 3, the memory system includes four memory devices 310_0 to 310_3, a control bus CMD/ADDR_BUS, four data buses DATA_BUS0 to DATA_BUS3 one for each memory device, and a memory controller 320. Although, the embodiment of FIG. 3, shows four memory devices, the invention is not limited in this way. In other embodiments, a plurality of memory devices may be employed, for example, 2, 3, 5 or more memory devices may be employed and controlled by a common memory controller.

Control signals may be transferred from the memory controller 320 to the memory devices 310_0 to 310_3 through the control bus CMD/ADDR_BUS. The control signals may include a command CMD, an address ADDR, and a clock CK. For example, the command CMD may include an active signal ACT, a row address strobe signal RAS, a column address strobe signal CAS, and a chip selection signal CS. Although the chip selection signal CS is included in the command CMD, the chip selection signal CS is Illustrated separately in FIG. 3 for emphasis. The address ADDR may include a plurality of signals. For example, the address ADDR may include a multi-bit bank group address, a multi-bit bank address, and a multi-bit normal address. The clock CK may be transferred from the memory controller 320 to the memory devices 310_0 to 310_3 for synchronization of the memory devices 310_0 to 310_3. The clock CK may be transferred in a differential scheme which includes a positive clock CK_t and a negative clock CK_c that is an inverted version of the positive clock CK_t.

The data buses DATA_BUS0 to DATA_BUS3 may be assigned respectively to the memory devices 310_0 to 310_3, and may transfer data between the memory controller 320 and the memory devices 310_0 to 310_3, respectively. Each of the data buses DATA_BUS0 to DATA_BUS3 may include four data transfer lines DATA00 to DATA03, DATA10 to DATA13, DATA20 to DATA23, and DATA30 to DATA33. Each of the data transfer lines DATA00 to DATA03, DATA10 to DATA13, DATA20 to DATA23, and DATA30 to DATA33 for each data bus may be coupled to a respective data of data pads DQ0 to DQ3 of a respective memory device 310_0 to 310_3. For example, data transfer lines DATA00, DATA01, DATA02 and DATA03 of the of the first data bus DATA_BUS0 are coupled to respective data pads DQ0, DQ1, DQ2, and DQ3 of the first memory device 310_0.

For illustrating the invention, let us suppose that one among the memory devices 310_0 to 310_3 may include unrepaired defective memory cells. For example, it is assumed that the memory cells of a 34$^{th}$ word line of a third memory bank in the memory device 310_2 are defective and remain unrepaired. The memory devices 310_0 to 310_3 may be included in a memory module, such as a dual in-line memory module (DIMM).

The memory controller 320 may control the memory devices 310_0 to 310_3 through the control bus CMD/ADDR_BUS, and may perform data communication with each of the memory devices 310_0 to 310_3 through the respective data buses DATA_BUS0 to DATA_BUS3. The memory controller 320 may be included in a processor such as a central processing unit (CPU), a graphic processing unit (GPU), an application processor (AP) and the like. In an embodiment, the memory controller 320 may be fabricated as an independent chip. In another embodiment, the memory controller may be mounted on a memory module.

The memory controller 320 may set up a latency value of the memory device 310_2 which includes the unrepaired defective memory cells, which is used to recognize signals on the control bus CMD/ADDR_BUS differently from those of the other memory devices 310_0, 310_1 and 310_3. This way, it is possible to continue using the memory device 310_2 instead of abandoning it, even though it contains unrepaired defective memory cells. This will be described in detail, hereafter, with reference to FIGS. 4 to 6.

Figure 4:
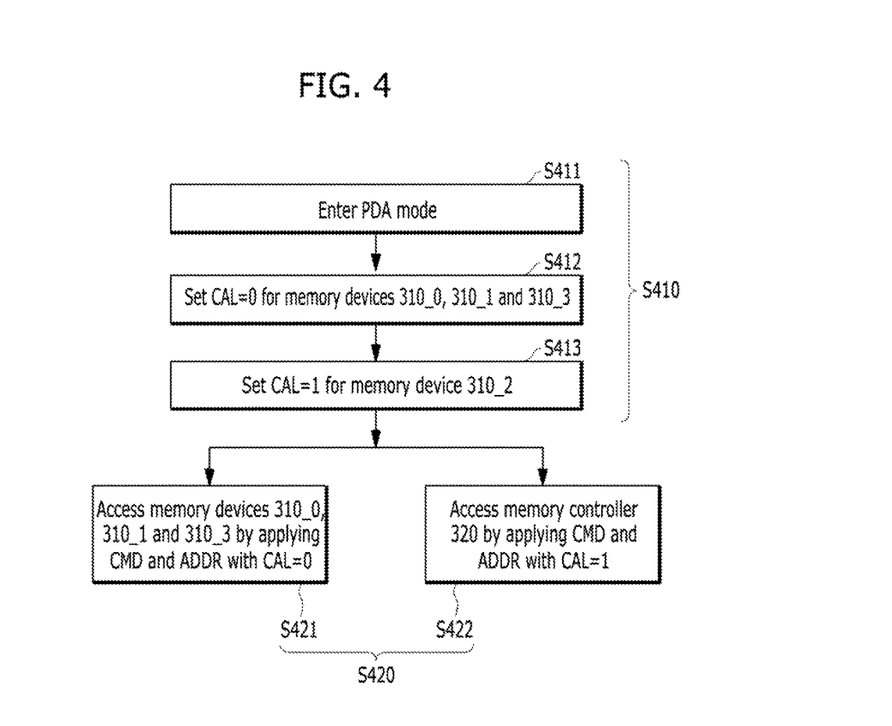
FIG. 4 is a flowchart describing an operation of the memory system shown in FIG. 3, in accordance with an embodiment of the present invention.

FIG. 4 is a flowchart describing an operation of the memory system shown in FIG. 3.

Figure 5:
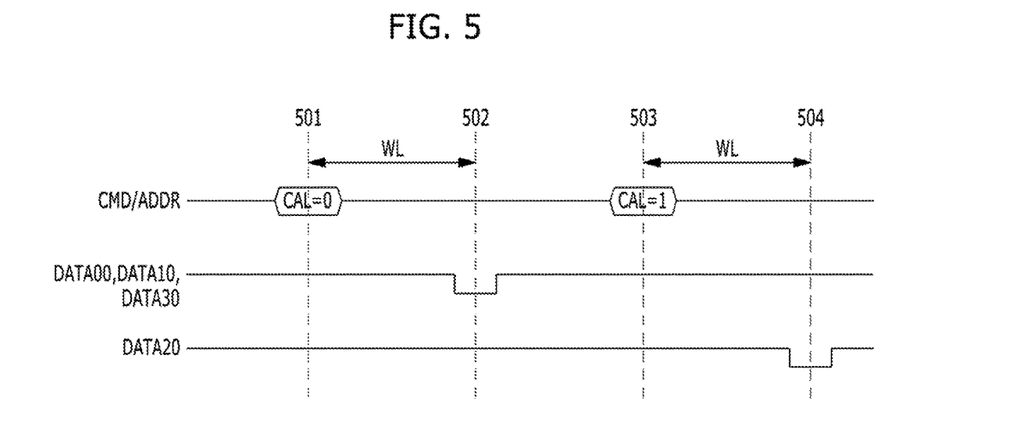
FIG. 5 is a timing diagram illustrating operations S412 and S413 of FIG. 4.

FIG. 5 is a timing diagram Illustrating operations S412 and S413 of FIG. 4.

Referring to FIG. 4, the operation of the memory system may include a first operation S410 in which the memory controller 320 sets up different latencies between the memory device 310_2 including the unrepaired defective memory cells and the other memory devices 310_0, 310_1 and 310_3, and a second operation S420 of accessing the memory devices 310_0 to 310_3.

At step S411 of the first operation S410, the memory controller 320 may control the memory devices 310_0 to 310_3 to enter the PDA mode by applying a combination of commands CMD to represent the MRS, and applying a combination of addresses ADDR to represent the entering of the PDA mode.

At step S412 of the first operation S410 in the PDA mode, a latency corresponding to the control bus CMD/ADDR_BUS of the memory devices 310_0, 310_1 and 310_3, which is the CAL, may be set to '0'. The operation of the step S412 may be performed by applying a combination of commands CMD to represent the MRS, applying a combination of addresses ADDR to represent the setting of the CAL to '0', and applying the signals of level '0' into the data transfer lines DATA00, DATA10 and DATA30 corresponding to the $0^{th}$ data pads DQ0 of the memory devices 310_0, 310_1 and 310_3 after time corresponding to the write latency WL (WL=AL+CWL) passes from the moment that the combinations of the commands CMD and the addresses ADDR are applied.

Referring to FIG. 5, it is exemplified that the command CMD and the address ADDR for setting up the CAL to '0' are applied to the memory devices 310_0, 310_1 and 310_3 at a moment '501', and the data transfer lines DATA00, DATA10 and DATA30 have a signal level of '0' at a moment '502' when the write latency WL passes from the moment '501'. Since the data transfer line DATA20 has a signal level of '1' at the moment '502', the memory device 310_2 including the unrepaired defective memory cells disregards the command CMD and the address ADDR applied at the moment '501'.

At step S413 of the first operation S410 in the PDA mode, the latency corresponding to the control bus CMD/ADDR_BUS of the memory device 310_2 including the unrepaired defective memory cells, which is the CAL, may be set to '1'. The operation of the step S413 may be performed by applying a combination of commands CMD to represent the MRS, applying a combination of addresses ADDR to represent the setting of the CAL to '1', and applying the signal of level '0' into the data transfer line DATA20 corresponding to the $0^{th}$ data pad DQ0 of the memory device 310_2 after time corresponding to the write latency WL (WL=AL+CWL) passes from the moment that the combinations of the commands CMD and the addresses ADDR are applied.

Referring to FIG. 5, it is exemplified that the command CMD and the address ADDR for setting up the CAL to '1' are applied to the memory device including the unrepaired defective memory cells at a moment '503', and the data transfer line DATA20 has a signal level of '0' at a moment '504' when the write latency WL passes from the moment '503'. Since the data transfer lines DATA00, DATA10 and DATA30 have a signal level of '1' at the moment '504', the normal memory devices 310_0, 310_1 and 310_3 disregard the command CMD applied at the moment '503'. Although it is illustrated in FIG. 5 that the CAL of the memory device 310_2 is set to '1' after the CALs of the memory devices 310_0, 310_1 and 310_3 are set to '0', it is obvious to those skilled in the art that the order may be changed.

Since the CALs of the normal memory devices 310_0, 310_1 and 310_3 and the CAL of the memory device 310_2 including the unrepaired defective memory cells are set differently, the memory controller 320 may access at step S421 of the second operation S420 the normal memory devices 310_0, 310_1 and 310_3 by applying the command CMD and the address ADDR at the moment when the chip selection signal CS is applied to the normal memory devices 310_0, 310_1 and 310_3, and may access at step S422 of the second operation S420 the memory device 310_2 including the unrepaired defective memory cells by applying the command CMD and the address ADDR at a moment that is one clock cycle away from the moment that the chip selection signal CS is applied to the memory device 310_2. In other words, although the memory devices 310_0 to 310_3 share the control bus CMD/ADDR_BUS, it is possible to apply different addresses to the normal memory devices 310_0, 310_1 and 310_3 and to the memory device 310_2 including the unrepaired defective memory cells.

Figure 6:
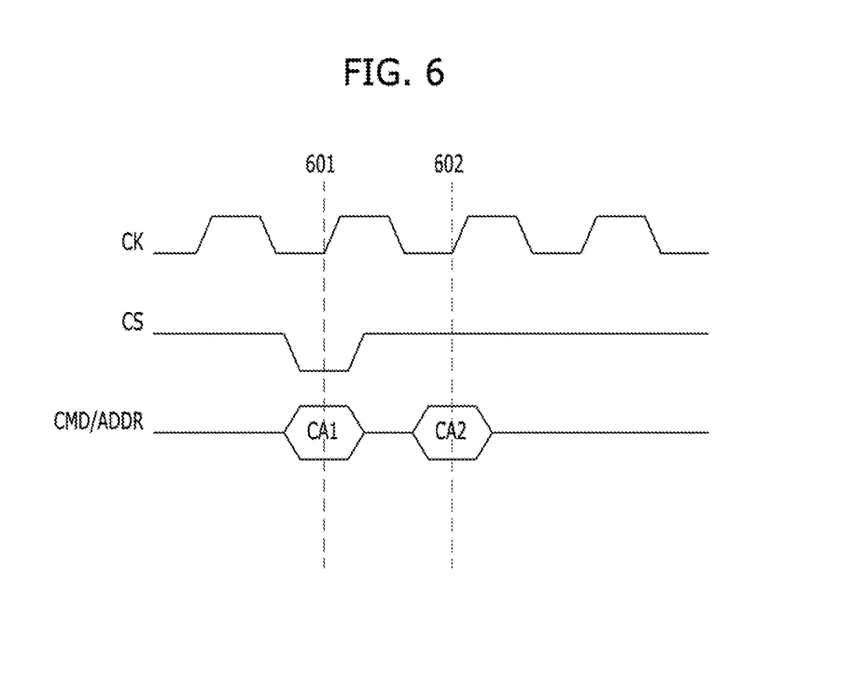
FIG. 6 is a timing diagram illustrating an operation of the memory system when the CALs of normal memory devices and the CAL of the memory device including unrepaired defective memory cells are set differently.

FIG. 6 is a timing diagram illustrating an operation of the memory system when the CAL of the normal memory devices 310_0, 310_1 and 310_3 and the CAL of the memory device 310_2 including the unrepaired defective memory cells are set differently.

Referring to FIG. 6, at a moment '601', the chip selection signal CS may be enabled and, at the same time represented by the set CAL of "0", a command and an address CA1 may be applied to the plurality of memory devices 310_0 to 310_3 through the control bus CMD/ADDR_BUS. The command and the address CA1 may be used for the memory controller 320 to control the normal memory devices 310_0, 310_1 and 310_3, and thus may be neglected by the memory device 310_2 including the unrepaired defective memory cells. At a moment '602' that is one clock cycle away from the moment that the chip selection signal CS is enabled, which is represented by the set CAL of "1", a command and an address CA2 may be applied to the plurality of memory devices 310_0 to 310_3 through the control bus CMD/ADDR_BUS. The command and the address CA2 may be used for the memory controller 320 to control the memory device 310_2 including the unrepaired defective memory cells, and thus may be neglected by the normal memory devices 310_0, 310_1 and 310_3.

The memory controller 320 may transfer the same command and the same address to the normal memory devices 310_0, 310_1 and 310_3 and the memory device 310_2 including the unrepaired defective memory cells in most cases. In other words, the command and the address CA1 and the command and the address CA2 may be the same in most cases.

However, when the command and the address CA1 applied to the normal memory devices 310_0, 310_1 and 310_3 indicate the same location as the unrepaired defective memory cells of the memory device 310_2, for example, the memory cells of the $34^{th}$ word line of the third memory bank in the normal memory devices 310_0, 310_1 and 310_3, the command and the address CA2 may be different from the command and the address CA1. In this case, the command and the address CA2 may be changed to indicate a normal memory cell other than the defective memory cell. For example, the command and the address CA2 may be changed to indicate the last word line of the third memory bank in the memory device 310_2 including the unrepaired defective memory cells.

As shown above, only when the unrepaired defective memory cells of the memory device 310_2 are about to be accessed, the memory controller 320 applies an address different from the address for the normal memory devices 310_0, 310_1 and 310_3 to the memory device 310_2 including the unrepaired defective memory cells. In this way, it becomes possible to use the memory device 310_2 including unrepaired defective memory cells, instead of abandoning the memory device 310_2.

Figure 7:
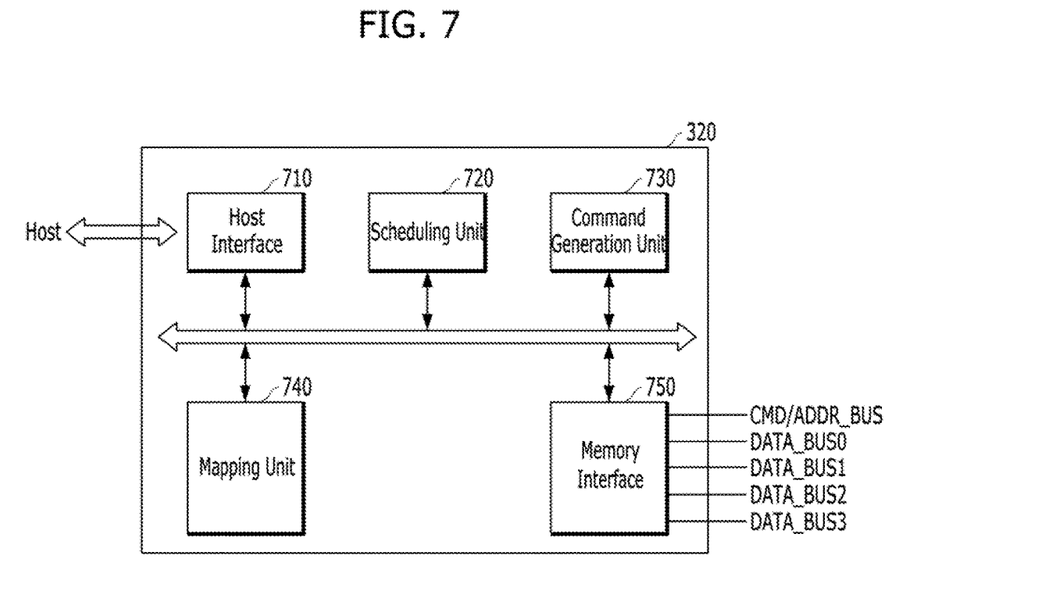
FIG. 7 is a block diagram illustrating an embodiment of a memory controller employed in the memory system of FIG. 3.

FIG. 7 illustrates an embodiment of the memory controller 320. Referring to FIG. 7, the memory controller 320 may include a host interface 710, a scheduling unit 720, a command generation unit 730, a mapping unit 740, and a memory interface 750 electrically coupled via an internal bus.

The host interface 710 provides interface between the memory controller 320 and a host. Through the host interface 710, requests from the host may be received to the memory controller 320, and the processing results of the requests may be transferred to the host.

The scheduling unit 720 may decide an order for the requests provided from the host to be transferred to the memory devices 310_0 to 310_3. In order to improve the performance of the memory devices 310_0 to 310_3, the scheduling unit 720 may arrange the requests to be transferred to the memory devices 310_0 to 310_3 differently from the order that the requests are received from the host. For example, although the host requests the memory devices 310_0 to 310_3 to perform a read operation first and then a write operation, the scheduling unit 720 may arrange the operation order so that the write operation is performed ahead of the read operation.

The command generation unit 730 may generate commands to be applied to the memory devices 310_0 to 310_3 in the operation order decided by the scheduling unit 720.

The mapping unit 740 may map the unrepaired defective memory cells to normal memory cells in the memory device 310_2 including the unrepaired defective memory cells. To be specific, for the case where the host requests to access the unrepaired defective memory cells of the memory device 310_2, the mapping unit 740 may map the address the unrepaired defective memory cells to the address of the normal memory cells so that the normal cells are replaced for the unrepaired defective memory cells in the memory device 310_2. To take an example, when the host requests to access the unrepaired defective memory cells coupled to the $34^{th}$ word line of the third memory bank in the memory device 310_2, the mapping unit 740 may generate an address of the last word line of the third memory bank mapped to the $34^{th}$ word line of the third memory bank in the memory device 310_2. For the mapping unit 740 to perform the operation, the mapping unit 740 should have information on which memory device among the memory devices 310_0 to 310_3 has the unrepaired defective memory cells and information on the positions of the unrepaired defective memory cells in that memory device. Such information may be inputted to the mapping unit 740 when the memory system is fabricated. Also, it may be possible to transfer the information on the unrepaired defective memory cells from the memory devices 310_0 to 310_3 to the memory controller 320 and store the information in the mapping unit 740 during the initialization operation of the memory devices 310_0 to 310_3.

The memory interface 750 makes it possible for the memory controller 320 to communicate with the memory devices 310_0 to 310_3 through the control bus CMD/ADDR_BUS and data buses DATA_BUS0 to DATA_BUS3. Since the CAL of the memory device 310_2 including the unrepaired defective memory cells is set up differently from the CALs of the normal memory devices 310_0, 310_1 and 310_3, the memory interface 750 may control the control bus CMD/ADDR_BUS in accordance to the way described in FIG. 6. By employing different CALs, the memory interface 750 may control the timing of the data bus DATA_BUS2 for the memory device 310_2 including the unrepaired defective memory cells and the timing of the data buses DATA_BUS0, DATA_BUS1 and DATA_BUS3 for the normal memory devices 310_0, 310_1 and 310_3. In short, it is possible to control the data communication through the data bus DATA_BUS2 to be performed one clock after the data communication through the data buses DATA_BUS0, DATA_BUS1 and DATA_BUS3.

According to the embodiments of the present invention, a memory device including unrepaired defective memory cells may be used instead of being abandoned.

While the present invention has been described with respect to the aforementioned specific embodiments, it will be apparent to those skilled in the art that various changes and modifications may be made without departing from the spirit and scope of the invention as defined in the following claims.

What is claimed is:

1. A memory system, comprising:
   a plurality of memory devices;
   a common control bus that is shared by the plurality of the memory devices;
   a plurality of data buses, each data bus being assigned to a respective memory device among the plurality of the memory devices; and
   a memory controller suitable for communicating with the plurality of the memory devices through the common control bus and the plurality of the data buses,
   wherein a second control latency of a defective memory device including an unrepaired defective memory cell is set differently from a first control latency of a normal memory device among the plurality of memory devices, and
   wherein the defective and normal memory devices recognize control signals of the control bus through the first and second control latencies.

2. The memory system of claim 1, wherein the memory controller includes a mapping unit suitable for mapping the unrepaired defective memory cell to a normal memory cell of the defective memory device.

3. The memory system of claim 2, wherein when the memory controller provides the normal memory device with a first address indicating the same location as the unrepaired defective memory cell, the memory controller provides the defective memory device with a second address indicating the normal memory cell mapped by the mapping unit.

4. The memory system of claim 3, wherein the memory controller transfers the first address according to the first control latency through the control bus, and transfers the second address according to the second control latency through the control bus.

5. The memory system of claim 3, wherein when the memory controller provides the normal memory device with a first address indicating different location from the unrepaired defective memory cell, the memory controller provides the defective memory device with the first address.

6. The memory system of claim 2, wherein the memory controller further includes:
   a host interface for communication with a host;
   a scheduling unit suitable for deciding a processing order for processing requests transferred from the host;
   a command generation unit suitable for generating a command to be applied to the plurality of the memory devices; and
   a memory interface for communication with the plurality of the memory devices.

7. The memory system of claim 1,
   wherein the control signals include a chip selection signal, command signals, and address signals, and
   wherein each of the first and second control latencies is a command address latency representing a timing difference between the chip selection signal and the other control signals.

8. The memory system of claim 1, wherein the normal memory device includes repaired defective memory cells.

9. The memory device of claim 1, wherein the plurality of memory devices are DRAM memories.

10. A method for operating a memory system comprising a plurality of memory devices and a memory controller communicating with the plurality of the memory devices through a control bus and a plurality of data buses, each data bus being assigned to a respective memory device among the plurality of the memory devices, the method comprising:

setting to a first value a command address latency of a normal memory device among the plurality of the memory devices;

setting to a second value different from the first value a command address latency of a defective memory device including an unrepaired defective memory cell among the plurality of the memory devices;

transferring a command and a first address according to the first value through the control bus thereby accessing the normal memory device; and transferring the command a second address different from the first address according to the second value through the control bus thereby accessing the defective memory device when the first address indicates the same location as the unrepaired defective memory cell.

11. The method of claim 10, wherein the setting and transferring steps are performed by the controller.

12. The method of claim 11, further comprising the controller transferring, the command and the first address according to the second value through the control bus thereby accessing the defective memory device when the first address indicates a location of a memory cell other than the unrepaired defective memory cell.

13. The method of claim 10, wherein the second address indicates a location of a memory cell for replacing the defective memory cell in the defective memory device.

14. A memory system, comprising:
a plurality of memory devices;
a memory controller suitable for communicating with the plurality of the memory devices and for setting a second control latency of a defective memory device including an unrepaired defective memory cell among the plurality of memory devices differently from a first control latency of a normal memory device among the plurality of memory devices, and wherein the defective and normal memory devices recognize control signals of the control bus through the first and second control latencies.

15. The memory system of claim 14, further comprising:
a common control bus that is shared by the plurality of the memory devices; and
a plurality of data buses, each data bus being assigned to a respective memory device among the plurality of the memory devices, wherein the memory controller communicates with a memory device among the plurality of the memory devices through the common control bus and a data bus corresponding to the memory device.

16. The memory system of claim 14, wherein the memory controller includes a mapping unit suitable for mapping the unrepaired defective memory cell to a normal memory cell of the defective memory device.

17. The memory system of claim 16, wherein when the memory controller provides the normal memory device with a first address indicating the same location as the unrepaired defective memory cell, the memory controller provides the defective memory device with a second address indicating the normal memory cell mapped by the mapping unit.

18. The memory system of claim 17, wherein the memory controller transfers the first address according to the first control latency through the control bus, and transfers the second address according to the second control latency through the control bus.

19. The memory system of claim 18, wherein when the memory controller provides the normal memory device with a first address indicating different location from the unrepaired defective memory cell, the memory controller provides the defective memory device with the first address.

20. The memory system of claim 14, wherein the plurality of memory devices are DRAM memories.

* * * * *